United States Patent
Choo et al.

(10) Patent No.: US 9,509,925 B2
(45) Date of Patent: Nov. 29, 2016

(54) DEVICE AND METHOD OF TRANSFERRING SENSED DATA IN IMAGE SENSOR

(71) Applicant: Samsung Electronics Co., Ltd., Suwon-si, Gyeonggi-do (KR)

(72) Inventors: Kyojin David Choo, Seoul (KR); Eun-Young Jin, Hwaseong-si (KR); Seung-Hyun Lim, Yongin-si (KR)

(73) Assignee: SAMSUNG ELECTRONICS CO., LTD., Samsung-ro, Yeongtong-gu, Suwon-si, Gyeonggi-do ( * ) Notice: Subject to any disclaimer, the term of this patent is extended or adjusted under 35 U.S.C. 154(b) by 0 days.

(21) Appl. No.: 14/589,216

(22) Filed: Jan. 5, 2015

(65) Prior Publication Data

US 2015/0244947 A1 Aug. 27, 2015

(30) Foreign Application Priority Data

Feb. 25, 2014 (KR) .................. 10-2014-0022127

(51) Int. Cl.
*H04N 5/335* (2011.01)
*H04N 5/369* (2011.01)
*H04N 5/374* (2011.01)
*H03M 1/14* (2006.01)

(52) U.S. Cl.
CPC ........... *H04N 5/3355* (2013.01); *H03M 1/145* (2013.01); *H04N 5/3692* (2013.01); *H04N 5/3698* (2013.01); *H04N 5/374* (2013.01)

(58) Field of Classification Search
None
See application file for complete search history.

(56) References Cited

U.S. PATENT DOCUMENTS

| | | | | |
|---|---|---|---|---|
| 5,461,425 A * | 10/1995 | Fowler | ............. | H04N 3/155 250/208.1 |
| 5,920,274 A * | 7/1999 | Gowda | ............. | H03M 1/123 341/155 |
| 6,380,880 B1 * | 4/2002 | Bidermann | ............. | H04N 1/195 341/155 |
| 6,873,364 B1 * | 3/2005 | Krymski | ............. | H04N 5/3575 348/300 |
| 7,135,998 B2 * | 11/2006 | Fey | ............. | H03M 1/1071 341/118 |
| 7,227,488 B2 * | 6/2007 | Cho | ............. | H03M 1/123 341/122 |
| 7,642,947 B2 | 1/2010 | Suzuki et al. | | |
| 7,659,925 B2 * | 2/2010 | Krymski | ............. | H04N 5/32 250/208.1 |
| 7,705,756 B2 * | 4/2010 | Harper | ............. | H03M 1/1225 341/141 |
| 7,786,921 B2 | 8/2010 | Nitta et al. | | |
| 8,035,717 B2 | 10/2011 | Hisamatsu | | |
| 8,431,905 B2 * | 4/2013 | Kondou | ............. | G01T 1/247 250/370.08 |
| 8,508,639 B2 * | 8/2013 | Mabuchi | ............. | H01L 24/17 250/370.01 |
| 8,576,979 B2 * | 11/2013 | Mo | ............. | H04N 5/355 377/108 |
| 9,007,981 B2 * | 4/2015 | Mihota | ............. | H04B 7/0413 370/312 |
| 9,041,583 B2 * | 5/2015 | Tanaka | ............. | H04N 5/3745 341/169 |
| 9,136,857 B2 * | 9/2015 | Bogner | ............. | H03M 1/1225 |
| 9,204,072 B2 * | 12/2015 | Hiyama | ............. | H04N 5/378 |
| 2003/0231540 A1 * | 12/2003 | Lazar | ............. | G11C 11/406 365/222 |
| 2004/0017494 A1 * | 1/2004 | Lu | ............. | H04N 3/155 348/294 |
| 2005/0012868 A1 * | 1/2005 | Shim | ............. | H04N 9/64 348/705 |

(Continued)

FOREIGN PATENT DOCUMENTS

JP 2012-151613 8/2012

*Primary Examiner* — Michael Osinski
(74) *Attorney, Agent, or Firm* — Muir Patent Law, PLLC

(57) ABSTRACT

An image sensor is provided. The image sensor includes a converter configured to convert a photoelectric converted analog signal in a unit pixel into a digital signal including a plurality of bits, a data transfer unit configured to selectively output the converted digital signal output from the converter in units of bits in response to a control signal, and including a plurality of switching circuits which are serially connected; and a memory configured to store data output from the data transfer unit.

13 Claims, 10 Drawing Sheets

(56) References Cited

U.S. PATENT DOCUMENTS

| | | | |
|---|---|---|---|
| 2006/0262205 A1* | 11/2006 | Lim | H04N 5/3456 348/241 |
| 2008/0239124 A1* | 10/2008 | Mori | H04N 3/155 348/308 |
| 2008/0284886 A1* | 11/2008 | Wakabayashi | H04N 5/335 348/301 |
| 2009/0278969 A1* | 11/2009 | Hisamatsu | H03K 23/548 348/308 |
| 2010/0245143 A1* | 9/2010 | Stanley | H03M 1/1225 341/141 |
| 2011/0025900 A1* | 2/2011 | Kondo | H04N 5/378 348/308 |
| 2011/0115543 A1* | 5/2011 | Teramoto | H03K 19/00361 327/419 |
| 2012/0097840 A1* | 4/2012 | Kim | H03M 1/002 250/208.1 |
| 2012/0320246 A1* | 12/2012 | Ikuma | H04N 5/3575 348/300 |
| 2013/0250148 A1* | 9/2013 | Park | H04N 5/217 348/241 |
| 2013/0335609 A1* | 12/2013 | Higuchi | H03M 1/145 348/302 |
| 2014/0034809 A1* | 2/2014 | Shen | H04N 5/3355 250/208.1 |
| 2015/0163403 A1* | 6/2015 | Wakabayashi | H04N 5/378 348/308 |

* cited by examiner

FIG. 8

| CSM0_0 | CSM0_1 | CSM1_0 | CSM1_1 | CSM2_0 | CSM2_1 | OBDTP |
|---|---|---|---|---|---|---|
| 0 | 0 | 0 | 0 | 0 | 0 | VSS |
| 1 | 0 | 0 | 0 | 0 | 0 | D0 |
| 0 | 1 | 0 | 0 | 0 | 0 | D1 |
| 1 | 1 | 0 | 0 | 0 | 0 | D2 |
| × | × | 1 | 0 | 0 | 0 | D3 |
| × | × | 0 | 1 | 0 | 0 | D4 |
| × | × | 1 | 1 | 0 | 0 | D5 |
| × | × | × | × | 1 | 0 | D6 |
| × | × | × | × | 0 | 1 | D7 |

DEVICE AND METHOD OF TRANSFERRING SENSED DATA IN IMAGE SENSOR

CROSS-REFERENCE TO RELATED APPLICATIONS

This application claims priority under 35 U.S.C. §119 to Korean Patent Application No. 10-2014-0022127 filed on Feb. 25, 2014, the entire contents of which are incorporated herein by reference in their entirety.

BACKGROUND OF THE INVENTION

1. Field of the Invention

Embodiments of the present general inventive concept relate to an image sensor, and more particularly, to a device and method of transferring data sensed by an image sensor.

2. Description of the Related Art

A solid state imaging device such as a complementary metal oxide semiconductor (CMOS) image sensor converts a photoelectric converted signal into a digital signal in a unit pixel of a pixel array connected to a column line in units of column lines, stores the converted digital signal in a memory, and transfers the stored memory signal to a signal processing device.

Recently, a column pitch is smaller in arrangement between column lines of the solid state imaging device, and the unit pixel is arranged in the smaller column pitch.

SUMMARY OF THE INVENTION

Accordingly, the present general inventive concept disclosed herein provides a data transfer circuit that is arranged in a smaller column pitch, transfers data at a high speed, and minimizes and/or prevents a short between transferred data.

Exemplary embodiments of the present general inventive concept provide device and method for effectively transferring data sensed by an image sensor at a high speed.

Additional features and utilities of the present general inventive concept will be set forth in part in the description which follows and, in part, will be obvious from the description, or may be learned by practice of the general inventive concept.

The features and utilities of the present general inventive concept are not limited to the disclosure herein, as other features and utilities may become apparent to those of ordinary skill in the art based on the following descriptions.

In exemplary embodiments of the present general inventive concept, an image sensor includes a converter configured to convert a photoelectric converted analog signal in a unit pixel into a digital signal including a plurality of bits; a data transfer unit configured to selectively output the converted digital signal output from the converter in units of bits in response to a control signal, and including a plurality of switching circuits which are serially connected; and a memory configured to store data output from the data transfer unit.

In one exemplary embodiment of the present general inventive concept, the converter may include n bit counters, where n is a natural number which is equal to or more than 2, where the data transfer unit may include n multiplexers corresponding to the n bit counters, respectively, and being serially connected, each of first input terminals of remaining multiplexers excluding a first stage multiplexer among the n multiplexers may be connected to an output terminal of a previous stage multiplexer, and a second input terminal of each of the n multiplexers may be connected to a corresponding bit counter.

In one exemplary embodiment of the present general inventive concept, a first input terminal of the first stage multiplexer may be connected to a power supply voltage.

In one exemplary embodiment of the present general inventive concept, each of the n multiplexers may selectively output an input signal of the first input terminal in response to a first state of a corresponding control signal, and selectively output an input signal of the second input terminal in response to a second state of the corresponding control signal.

In one exemplary embodiment of the present general inventive concept, the first state of the control signal may be a logic "low", and the second state of the control signal may be a logic "high".

In another exemplary embodiment of the present general inventive concept, the converter may include n bit counters, wherein n is a natural number which is equal to or more than 4, and the n bit counters may be grouped by a sequentially connected bit counters, where a is a natural number which is equal to or more than 2. The data transfer unit may include serially connected n/a multiplexers corresponding to the groups of the a sequentially connected bit counters, respectively, each of first input terminals of remaining multiplexers excluding a first stage multiplexer among the serially connected n/a multiplexers may be connected to an output terminal of a previous stage multiplexer, and each of remaining a input terminals of each of the n/a multiplexers may be connected to a corresponding bit counter.

In another exemplary embodiment of the present general inventive concept, an input terminal of the first stage multiplexer may be connected to a power supply voltage.

In another exemplary embodiment of the present general inventive concept, each of the n/a multiplexers may selectively output one among input signals of a+1 input terminals in response to states of corresponding a control signals.

In another exemplary embodiment of the present general inventive concept, when states of the a control signals are a first state, an input signal of a first input terminal among the a+1 input terminals may be selectively output, and when a control signal corresponding to each of remaining input terminals excluding the first input terminal is transitioned from the first state to a second state, a input signal of remaining input terminals excluding the first input terminal may be selectively output.

In another exemplary embodiment of the present general inventive concept, the first state may be a logic "low", and the second state may be a logic "high".

In still another exemplary embodiment of the present general inventive concept, the converter may include n bit counters, where n is a natural number which is equal to or more than 6, and the n bit counters may be grouped by a sequentially connected bit counters, where a is a natural number which is equal to or more than 3. The data transfer unit may include serially connected n/a multiplexers corresponding to the groups of the a sequentially connected bit counters, respectively, each of first input terminals of remaining multiplexers excluding a first stage multiplexer among the serially connected n/a multiplexers may be connected to an output terminal of a previous multiplexer, each of remaining a input terminals of each of the n/a multiplexers may be connected to a corresponding bit counter, and each of the n/a multiplexers may selectively output an input signal according to b control signals, and $2^b = a+1$.

In still another exemplary embodiment of the present general inventive concept, each of the n/a multiplexers may selectively output one among input signals of the a+1 input terminals in response to states of corresponding b control signals.

The input signals of the a+1 input terminals may be selectively output according to combinations of states of the b control signals.

In exemplary embodiments of the present general inventive concept, an image sensor includes: a pixel array including a plurality of row lines and a plurality of column lines, and a plurality of unit pixels connected between the row line and the column line, a plurality of column comparators connected to the plurality of column lines, respectively, a plurality of column counters connected to the plurality of column comparators, respectively, a plurality of column multiplexers connected to the plurality of column counters, respectively, and a plurality of column memories connected to the plurality of column multiplexers, respectively, where each of the column counters includes a plurality of bit counters arranged in a column line direction, each of the column multiplexers includes a plurality of bit multiplexers adjacent to a corresponding column counter and arranged in the column line direction, each of output terminals of bit multiplexers excluding the last stage bit multiplexer among the plurality of bit multiplexers is connected to a first input terminal of a corresponding next stage bit multiplexer, each of remaining input terminals excluding the first input terminal of each of the plurality of bit multiplexers is connected to a corresponding bit counter, and each of the column memories includes a plurality of bit memories arranged in the column line direction.

In an exemplary embodiment of the present general inventive concept, a first input terminal of a first stage bit multiplexer among the plurality of bit multiplexers may be connected to a power supply voltage, and an output terminal of the last stage bit multiplexer among the plurality of bit multiplexers may be commonly connected to the plurality of bit memories.

Exemplary embodiments of the present general inventive concept may also include an image sensor including a pixel array including a plurality of row lines and a plurality of column lines, and a plurality of unit pixels connected between the plurality of row lines and the plurality of column lines, respectively, a plurality of column comparators connected to the plurality of column lines, respectively, a plurality of column counters connected to the plurality of column comparators, respectively, a plurality of column multiplexers connected to the plurality of column counters, respectively, and a plurality of column memories connected to the plurality of column multiplexers, respectively, where the plurality of column comparators compare a reference signal voltage with a voltage signal of a corresponding column line, and when the reference signal voltage is greater than or equal to a voltage signal of the corresponding column line, a counting operation of the corresponding column counter is stopped, and a corresponding multiplexer transfers a final counting value of the corresponding column counter to a corresponding column memory.

The image sensor may include a reference signal generating circuit connected to the plurality of column comparators to generate the reference signal voltage, where the plurality of column counters are initialized in response to a reset signal, perform the counting operation in response to a clock signal, and stop the counting operation in response to an inverted output signal of the corresponding column counter.

The image sensor may include where the final counting value is transferred by the corresponding multiplexer to the corresponding column memory to be stored in response to a multiplexer control signal.

The image sensor may include where the corresponding column memory stores the final counting value transferred from the corresponding column multiplexer in response to a memory control signal.

The image sensor may include where a plurality of switching circuits connected to the plurality of column memories to selectively output a respective final counting value stored in the corresponding column memory in response to a control signal.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 8 is a logic diagram illustrating an operation of the circuit to transfer data illustrated in FIG. 7;

DETAILED DESCRIPTION OF THE PREFERRED EMBODIMENTS

Figure 1:
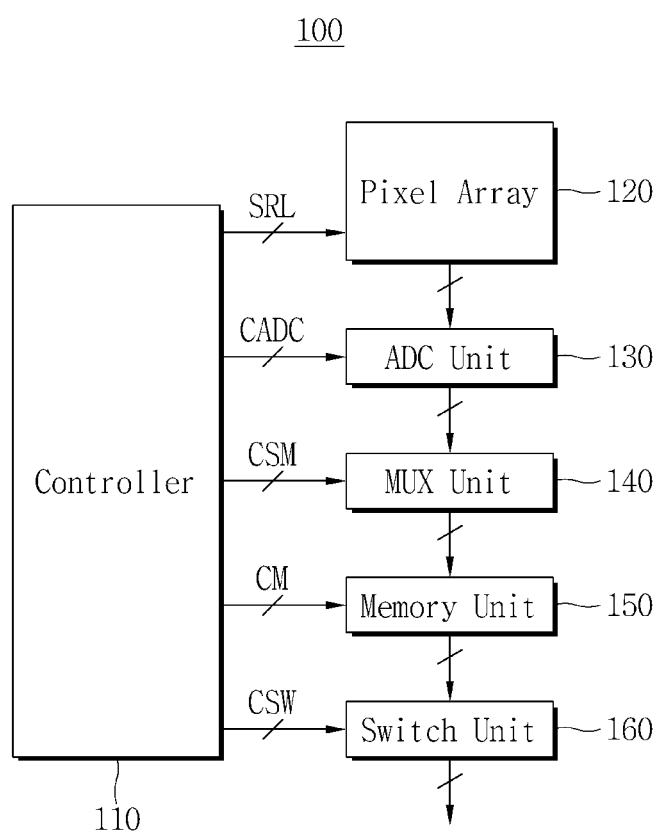
FIG. 1 is a diagram illustrating an image sensor according to an exemplary embodiment of the present general inventive concept.

Example embodiments of the present invention are described below in sufficient detail to enable those of ordinary skill in the art to embody and practice the present invention. It is important to understand that the present invention may be embodied in many alternate forms and should not be construed as limited to the example embodiments set forth herein.

Various embodiments will now be described more fully with reference to the accompanying drawings in which some embodiments are shown. These inventive concepts may, however, be embodied in different forms and should not be construed as limited to the embodiments set forth herein. Although a few embodiments of the inventive concept have been shown and described, it would be appreciated by those of ordinary skill in the art that changes may be made in these exemplary embodiments without departing from the principles and spirit of the inventive concept, the scope of which is defined in the claims and their equivalents.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Meanwhile, when it is possible to implement any embodiment in any other way, a function or an operation specified in a specific block may be performed differently from a flow specified in a flowchart. For example, consecutive two blocks may actually perform the function or the operation simultaneously, and the two blocks may perform the function or the operation conversely according to a related operation or function.

Embodiments of the present general inventive concept will be described below with reference to the accompanying drawings.

FIG. 1 is a diagram illustrating an image sensor according to an exemplary embodiment of the present general inventive concept.

Referring to FIG. 1, an image sensor 100 may include a controller 110 to control each element of the image sensor 100, a pixel array 120 in which a plurality of unit pixels to perform a photoelectric conversion operation are arranged, an analog to digital converter (ADC) unit 130 to convert the photoelectric converted analog signal into a digital signal, a multiplexer (MUX) unit 140 to transfer the converted digital signal according to a control signal, a memory unit 150 for storing the converted digital signal, and a switch unit 160 to control the transfer of the digital signal stored in the memory unit 150 to the outside.

The controller 110 may apply a row line signal SRL having a predetermined voltage to the pixel array 120, apply an analog to digital converter control signal CADC to the analog to digital converter unit 130, apply a multiplexer control signal CSM to the MUX unit 140, apply a memory control signal CM to the memory unit 150, and apply a switch control signal CSW to the switch unit 160. The controller 110 may be a processor, an integrated circuit, a field programmable gate array, and/or a programmable logic device.

Figure 2:
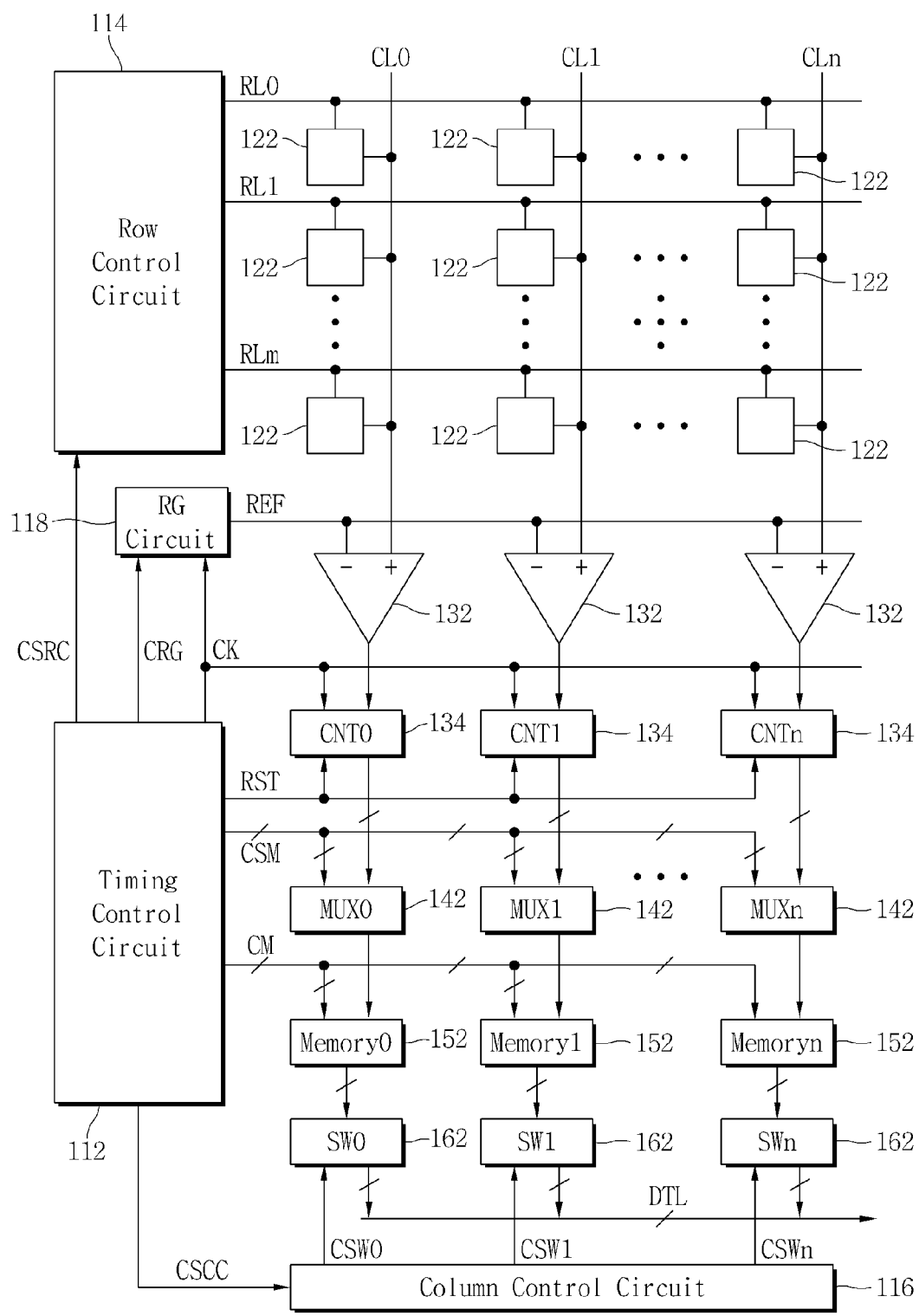
FIG. 2 is a diagram illustrating a detailed construction of the image sensor illustrated in FIG. 1.

The pixel array 120 may have the plurality of unit pixels (e.g., unit pixels 122 as illustrated in FIG. 2 and discussed below) arranged in a matrix form and configured to perform the photoelectric conversion operation in response to the row line signal SRL. That is, the pixel array 120 performs a photoelectric conversion of light received by one or more of the unit pixels of the pixel array 120 to an analog electrical signal.

The ADC unit 130 may convert the photoelectric converted analog signal (e.g., the analog electrical signal) into the digital signal in response to the analog to digital converter control signal CADC.

The MUX unit 140 may transfer the converted digital signal to the memory unit 140 in response to the multiplexer control signal CSM. The MUX unit 140 may be an electrical multiplexer circuit.

The memory unit 150 may store the converted digital signal in a memory in response to the memory control signal CM. The memory unit 150 may be an integrated circuit memory device.

The switch unit 160 may transfer the digital signal stored in the memory (e.g., memory unit 150) to the outside in response to the switch control signal CSW. The switch unit 160 may be an electrical circuit and/or any other suitable electrical device to transfer the digital signal stored in the memory unit 150.

FIG. 2 is a diagram illustrating a detailed construction of the image sensor illustrated in FIG. 1

Referring to FIGS. 1 and 2, the controller 110 may include a timing control circuit 112, a row control circuit 114, a column control circuit 116, and a reference signal generating (RG) circuit 118.

The timing control circuit 112 may output control signals to control operation timings of other elements of the image sensor 100.

The timing control circuit 112 may output a row control signal CSRC to control the row control circuit 114, a column control signal CSCC to control the column control circuit 116, a reference signal generating control signal CRG to control the RG circuit 118, a clock signal CK, a reset signal RST to reset counters 134, a multiplexer control signal CSM to control multiplexers 142, and a memory control signal CM to control memories 152.

The row control circuit 114 may apply the row line signal SRL having a predetermined voltage to each of row lines RL0, RL1, . . . , RLm included in the pixel array 120 in response to the row control signal CSRC in units of row lines.

The column control circuit 116 may apply column switch control signals CSW0, CSW1, . . . , CSWn to n+1 column switches 162 corresponding to a plurality of column lines CL0, CL1, . . . , CLn in response to a column control signal CSCC, respectively.

The RG circuit 118 may generate a reference signal REF in response to the reference signal generating control signal CRG and the clock signal CK. The reference signal REF may be a step wave having a ramp waveform, or may be any other suitable waveform. The RG circuit 118 may start or end to generate the reference signal REF in response to the reference signal generating control signal CRG, and sequentially increase or decrease a step of the reference signal REF which is the step wave in response to the clock signal CK.

The pixel array 120 may include m+1 row lines RL0, RL1, . . . , RLm and the n+1 column lines CL0, CL1, . . . , CLn, and (m+1)×(n+1) unit pixels 122 arranged in each of intersecting points of the m+1 row lines RL0, RL1, . . . , RLm and the n+1 column lines CL0, CL1, . . . , CLn and connected to corresponding row line and column line.

Each of the unit pixels 122 may include a photodiode and an amplifier, and may perform a photoelectric conversion operation to convert a light incident on a unit pixel into an electric signal (that is, an analog signal) in response to the row line signal SRL applied to a corresponding row line (e.g., RL0, RL1, . . . , RLm), and output the converted analog signal to a corresponding column line (e.g., CL0, CL1, . . . , CLn).

The ADC unit 130 may include n+1 column comparators 132 connected to the n+1 column lines CL0, CL1, . . . , CLn, respectively, and n+1 column counters (CNT0 to CNTn) 134 to receive output signals of the n+1 column comparators 132, respectively.

Each of the column comparators 132, which may be electrical circuits, may compare the reference signal REF with a voltage signal of a corresponding column line, and output the comparing result. When a voltage of the reference signal REF is equal to or greater than a voltage of the voltage signal of the corresponding column line, an output of the column comparator 132 may be inverted, and then a counting operation of the column counter 134 may be stopped.

Each of the column counters 134 may initialize (for example, "0") a counting value in response to the reset signal RST, perform an up or down counting operation in response to the clock signal CK, and stop the counting operation in response to the inverted output signal of a corresponding column comparator 132.

Each of the column counters 134 may be an asynchronous counter circuit that a plurality of flip-flops are serially connected.

The ADC unit 130 may generate digital data corresponding to an amount of light incident on the unit pixel 122. That is, the ADC unit 130 may generate digital data by converting the analog signal received from each unit pixel 122 which converts the received incident light to an analog signal.

The MUX unit 140 may include n+1 column multiplexers (MUX0 to MUXn) 142 connected to the n+1 counters 134, respectively, and each of the column multiplexers 142 may transfer a final counting value of a corresponding column counter 134 to a corresponding column memory (Memory0 to Memoryn) 152 in response to the multiplexer control signal CSM.

The memory unit 150 may include n+1 column memories 152 connected to the n+1 multiplexers 142, respectively, and each of the column memories 152 may store the final counting value transferred from a corresponding column multiplexer 142 in response to the memory control signal CM.

The switch unit 160 may include n+1 column switches (SW0 to SWn) 162 connected to the n+1 memories 152, respectively, and each of the column switches 162 may output data stored in a corresponding column memory 152 to the outside through a data transfer line DTL in response to a corresponding column switch signal CSW0, CSW1, . . . , or CSWn.

Figure 3:
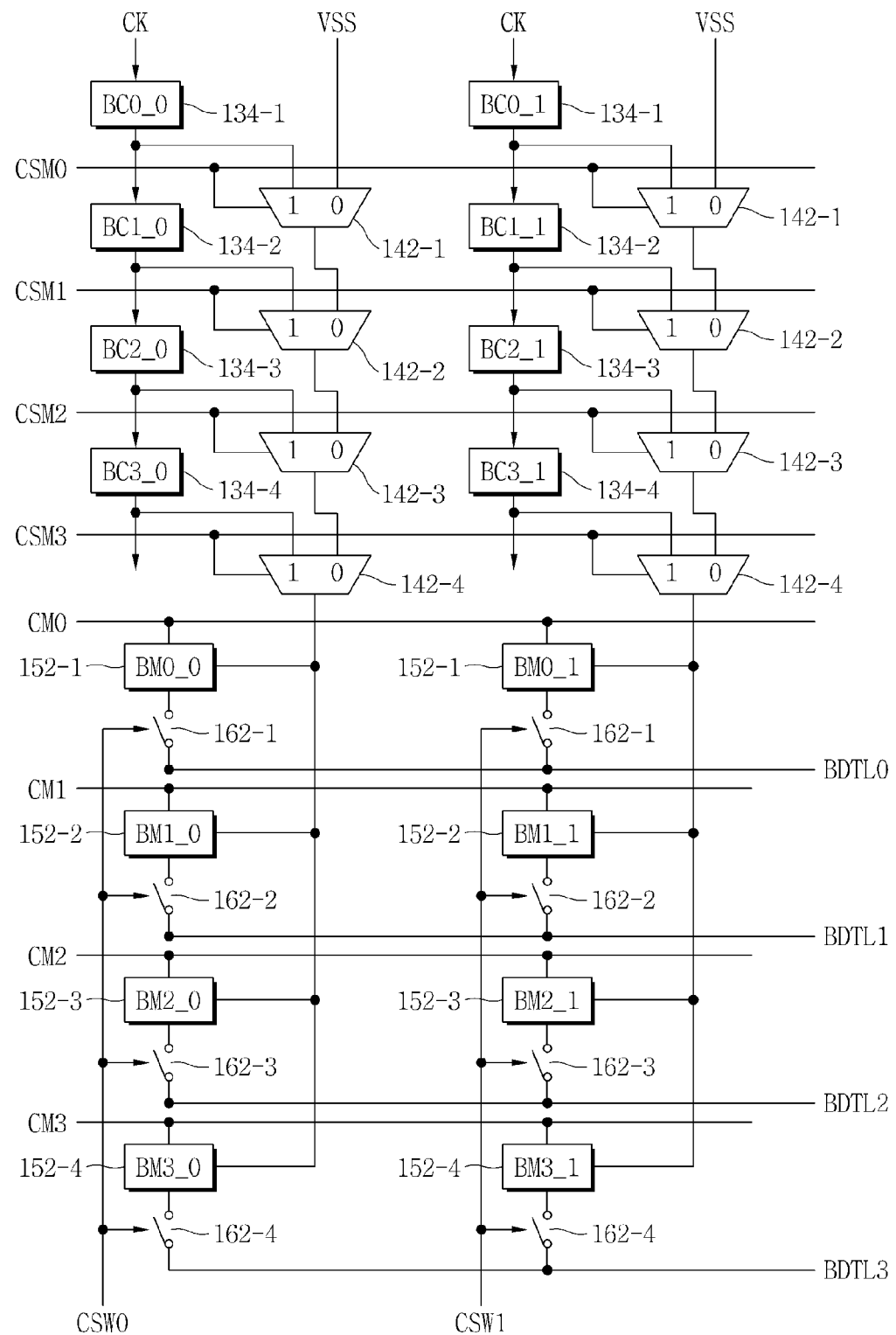
FIG. 3 is a diagram illustrating a circuit to transfer data including a counter, a multiplexer, a memory, and a switch illustrated in FIG. 2.

FIG. 3 is a diagram illustrating a circuit to transfer data including a counter, a multiplexer, a memory, and a switch illustrated in FIG. 2.

Referring to FIGS. 2 and 3, two column data transfer circuits corresponding to a first column line CL0, and a second column line CL1 are illustrated in FIG. 3 for convenience.

The column data transfer circuit may include a column counter (CNT0, CNT1, . . . , or CNTn) 134, a column multiplexer (MUX0, MUX1, . . . , or MUXn) 142, a column memory (Memory0, Memory1, . . . , or Memoryn) 152, and a column switch (SW0, SW1, . . . , or SWn) 162 which are related to a corresponding column line.

For example, a first column data transfer circuit corresponding to the first column line CL0 may include a first column counter (CNT0) 134, a first column multiplexer (MUX0) 142, a first column memory (Memory0) 152, and a first column switch (SW0) 162.

As an example, the first column counter (CNT0) 134 may be a four-bit counter, and may include four bit counters (BC0_0) 134-1, (BC1_0) 134-2, (BC2_0) 134-3, and (BC3_0) 134-4.

The four bit counters (BC0_0) 134-1, (BC1_0) 134-2, (BC2_0) 134-3, and (BC3_0) 134-4 configuring the first column counter may perform an up or down counting operation in response to the clock signal CK.

The first column multiplexer (MUX0) 142 may include serially connected four bit multiplexers 142-1, 142-2, 142-3, and 142-4 connected to the four bit counters (BC0_0) 134-1, (BC1_0) 134-2, (BC2_0) 134-3, and (BC3_0) 134-4, respectively.

A path formed by the serially connected four bit multiplexers may be referred to as a bit data transfer path for transferring bit data.

One input terminal of each bit multiplexer may be connected to an output terminal of a corresponding bit counter, and other input terminal of each bit multiplexer may be connected to an output terminal of a previous stage bit multiplexer. However, other input terminal of the first bit multiplexer 142-1 may be connected to a power supply voltage VSS.

Each bit multiplexer may selectively output a bit counting value of a corresponding bit counter or an output signal of the previous stage bit multiplexer in response to a corresponding bit multiplexer control signal CSM0, CSM1, CSM2, or CSM3. However, the first bit multiplexer 142-1 may selectively output a bit counting value of a corresponding bit counter 134-1 or the power supply voltage VSS in response to a corresponding bit multiplexer control signal CSM0.

For example, when the bit multiplexer control signal (e.g., CSM0, CSM1, CSM2, or CSM3) is in a logic "high" state, each bit multiplexer may output a bit counting value of a connected bit counter, and when the bit multiplexer control signal is in a logic "low" state, each bit multiplexer may output an output signal of a previous stage multiplexer, or the power supply voltage (e.g., the power supply voltage VSS).

The first column memory (Memory0) 152 may include four bit memories (BM0_0) 152-1, (BM1_0) 152-2, (BM2_0) 152-3, and (BM3-0) 152-4 corresponding to the bit counter of the first column counter. Each of bit memories may be commonly connected to an output terminal of the last stage multiplexer 142-4, and may store a bit counting value of a corresponding bit counter in response to a corresponding bit memory control signal CM0, CM1, CM2, or CM3.

The first column switch (SW0) 162 may include four bit switches 162-1, 162-2, 162-3, and 164-4 corresponding to a bit memory of the first column memory. The bit switches may transfer four bit data stored in the four bit memories (e.g., (BM0_0) 152-1, (BM1_0) 152-2, (BM2_0) 152-3, and (BM3-0) 152-4) of the first column memory (Memory0) 152 to the outside in parallel through corresponding bit data transfer lines BDTL0, BDTL1, BDTL2, and BDTL3, respectively, in response to a first column switch control signal CSW0.

Description of the first column transfer circuit may be equally applied to a second column transfer circuit corresponding to the second column line CL1, and may be similarly applied to that of remaining column data transfer circuits corresponding to remaining column lines.

The image sensor according to an exemplary embodiment of the present general inventive concept may include a pixel array including a plurality of row lines and a plurality of column lines, and a plurality of unit pixels connected between the plurality of row lines and the plurality of column lines, respectively, a plurality of column comparators connected to the plurality of column lines, respectively, a plurality of column counters connected to the plurality of column comparators, respectively, a plurality of column multiplexers connected to the plurality of column counters, respectively, and a plurality of column memories connected to the plurality of column multiplexers, respectively.

The plurality of bit counters configuring the column counter may be arranged in a column line direction, the plurality of bit multiplexers configuring the column multiplexer may be adjacent to the plurality of bit counters, respectively, and be arranged in the column line direction, each of output terminals of the bit multiplexers excluding the last stage bit multiplexer among the plurality of bit multiplexers may be connected to a first input terminal of a next stage bit multiplexer, each of second input terminals excluding the first input terminals of the plurality of bit multiplexers may be connected to a corresponding bit counter, and the plurality of bit memories configuring the column memory may be arranged in the column line direction.

A first input terminal of a first stage bit multiplexer among the plurality of bit multiplexers may be connected to a power supply voltage, and an output terminal of the last stage bit multiplexer among the plurality of bit multiplexers may be commonly connected to the plurality of bit memories.

Figure 4:
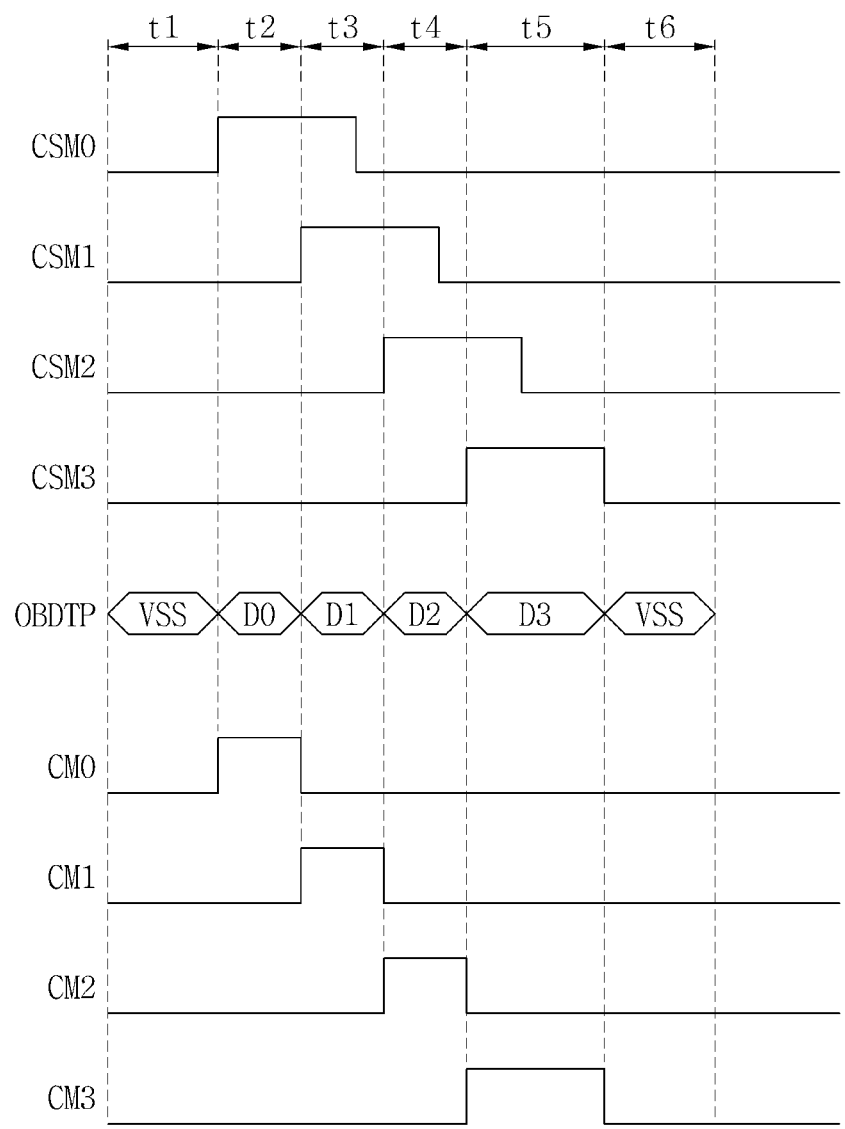
FIG. 4 is a timing diagram illustrating an operation of the circuit to transfer data illustrated in FIG. 3.

FIG. 4 is a timing diagram illustrating an operation of the circuit to transfer data illustrated in FIG. 3.

Referring to FIGS. 3 and 4, in periods t1 and t6 when every bit multiplexer control signal (e.g., CSM0, CSM1, CSM2, or CSM3) is in a logic "low" state, a signal OBDTP output through a bit data transfer path (e.g., bit data transfer path from the first bit multiplexer 142-1 to the last stage bit multiplexer 142-4) may be a power supply voltage VSS.

In a period t2 when only a first bit multiplexer control signal CSM0 is a logic "high" state, the signal OBDTP output through the bit data transfer path may be a first bit counting value D0 of a first bit counter 134-1, and the first bit counting value D0 may be stored in a first bit memory 152-1 when a first bit memory control signal CM0 is transitioned to a logic "high" during the first bit counting value D0 is output.

In a period t3 when a second bit multiplexer control signal CSM1 is a logic "high" state and every bit multiplexer control signal CSM2 to CSM3 applied to next stage bit multiplexers is in a logic "low" state, the signal OBDTP output through the bit data transfer path may be a second bit counting value D1 of the second bit counter 134-2, and a second bit counting value D1 may be stored in a second bit memory 152-2 when a second bit memory control signal CM1 is transitioned to a logic "high" during the second bit counting value D1 is output.

Since description of transferring and storing the second bit counting value D1 is similarly applied to that of transferring and storing of a third bit counting value D2 and a fourth bit counting value D3, the description of transferring and storing the third and fourth bit counting values D2 and D3 will be omitted.

In the present general inventive concept, a short-circuited current is not generated between outputs of the bit counters by using a multiplexer as a switching circuit to selectively transfer a bit counting value, a margin sufficient to control timing between control signals for transferring the bit counting values is secured, and a high speed operation is available.

Figure 5:
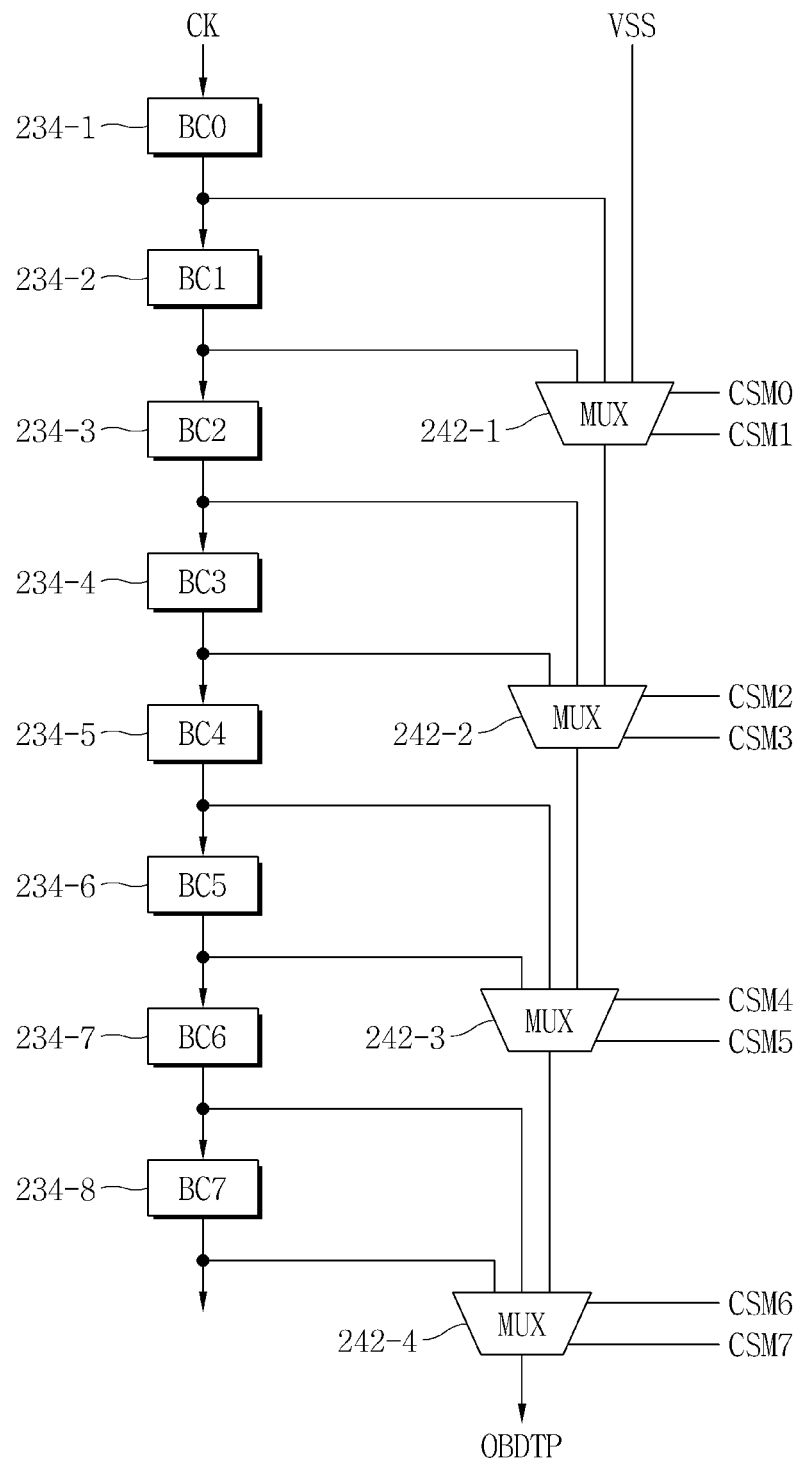
FIG. 5 is a diagram illustrating a circuit to transfer data including a counter and a multiplexer according to another exemplary embodiment of the present general inventive concept.

FIG. 5 is a diagram illustrating a circuit to transfer data including a counter and a multiplexer according to another exemplary embodiment of the present general inventive concept.

Referring to FIGS. 2 and 5, one column data transfer circuit corresponding to one column line is illustrated in FIG. 5 for convenience.

The column data transfer circuit may include a column counter 134, a column multiplexer 142, a column memory 152, and a column switch 162 which are related to a corresponding column line.

For example, a first column data transfer circuit corresponding to a first column line CL0 may include a first column counter (CNT0), a first column multiplexer (MUX0), a first column memory (Memory0), and a first column switch (SW0).

In FIG. 5, a column memory and a column switch in the column data transfer circuit corresponding to one column line are omitted for convenience, but this is because the column memory and the column switch have a similar construction to those illustrated in FIG. 3. Since the column counter illustrated in FIG. 5 is an eight-bit counter, the number of the bit memory of the column memory and the number of the bit switch of the column switch may be 8, respectively. Further, it will be described by supposing that the column data transfer circuit of FIG. 5 corresponds to a first column line CL0 (e.g., as illustrated in FIG. 2) for convenience.

As an example, a first column counter (ONT0) 134-1 (e.g., as illustrated in FIG. 3) may be an eight-bit counter, and eight bit counters may include (BC0) 234-1, (BC1) 234-2, (BC2) 234-3, (BC3) 234-4, (BC4) 234-5, (BC5) 234-6, (BC6) 234-7, and (BC7) 234-8, as illustrated, for example, in FIG. 5.

The eight bit counters configuring the first column counter (ONT0) may perform an up or down counting operation in response to the clock signal CK.

A first column multiplexer (e.g., MUX0 as illustrated in FIG. 2) may include a serially connected four bit multiplexers 242-1, 242-2, 242-3, and 242-4 connected to corresponding bit counters (e.g., (BC0) 234-1, (BC1) 234-2, (BC2) 234-3, (BC3) 234-4, (BC4) 234-5, (BC5) 234-6, (BC6) 234-7, and (BC7) 234-8).

A path formed by the serially connected four bit multiplexers 242-1, 242-2, 242-3, and 242-4 may be referred to as a bit data transfer path for transferring bit data.

A first input terminal of each of the four bit multiplexers 242-1, 242-2, 242-3, and 242-4 may be connected to an output terminal of a previous stage bit multiplexer, and a second input terminal and a third input terminal of each of the four bit multiplexers 242-1, 242-2, 242-3, and 242-4 may be connected to output terminals of corresponding bit counter. However, the first input terminal of a first bit multiplexer 242-1 may be connected to a power supply voltage VSS.

Each of the four bit multiplexers 242-1, 242-2, 242-3, and 242-4 may be selectively output bit counting values of corresponding bit counters or an output signal of a previous stage bit multiplexer in response to corresponding bit multiplexer control signals. However, the first bit multiplexer 242-1 may be selectively output bit counting values of corresponding bit counters 234-1 and 234-2 in response to corresponding bit multiplexer control signals CSM0 and CSM1 or the power supply voltage VSS.

For example, when both a first control signal CSM0 and a second control signal CSM1 are a logic "low," the first bit multiplexer 242-1 may output the power supply voltage VSS, when the first control signal CSM0 is transitioned to a logic "high," the first bit multiplexer 242-1 may output a bit counting value of a corresponding bit counter 234-1, and when the second control signal CSM1 is transitioned to a logic "high," the first bit multiplexer 242-1 may output a bit counting value of a corresponding bit counter 234-2.

When both a first control signal CSM2 and a second control signal CSM3 are a logic "low," the second bit multiplexer 242-2 may output an output signal of a previous stage bit multiplexer 242-1, when the first control signal CSM2 is transitioned to a logic "high," the second bit multiplexer 242-2 may output a bit counting value of a corresponding bit counter 234-3, and when the second control signal CSM3 is transitioned to a logic "high", the second bit multiplexer 242-2 may output a bit counting value of a corresponding bit counter 234-4.

Since description of the second bit multiplexer is similarly applied to that of the third and fourth bit multiplexers 242-3 and 242-4, the description of the third and fourth bit multiplexers 242-3 and 242-4 will be omitted.

Consequently, the fourth bit multiplexer 242-4 which is the last stage bit multiplexer may output a signal OBDTP output through the bit data transfer path.

In another embodiment, the bit counters corresponding to each bit multiplexer may be two sequential bit counters, and the number of control signals of each bit multiplexer is two which is equal to the number of bit counters. However, according to other embodiments, three or more sequential bit counters may be connected to a corresponding bit multiplexer, and each bit multiplexer may be controlled by three or more control signals.

Figure 6:
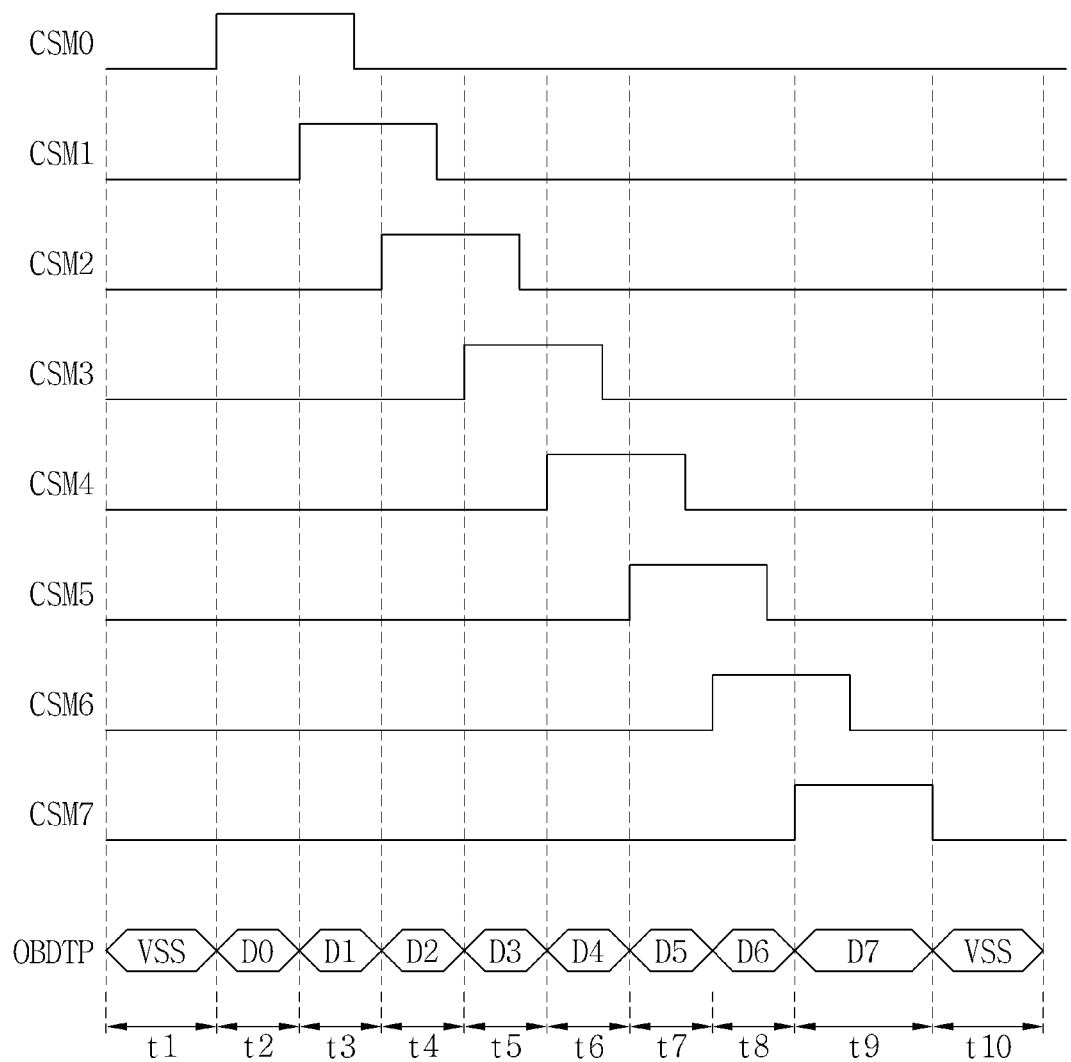
FIG. 6 is a timing diagram illustrating an operation of the circuit to transfer data illustrated in FIG. 5.

FIG. 6 is a timing diagram illustrating an operation of the circuit to transfer data illustrated in FIG. 5.

Referring to FIGS, 5 and 6, in periods t1 and t10 when every bit multiplexer control signal CSM0 to CSM 7 is in a logic "low" state, a signal OBDTP output through the bit data transfer path may be a power supply voltage VSS.

In a period t2 when only the first bit multiplexer control signal CSM0 is in a logic "high" state, the signal output through the bit data transfer path may be a bit counting value D0 of a first bit counter 234-1.

In a period t3 when the second bit multiplexer control signal CSM1 is transitioned to a logic "high" and the bit multiplexer control signals CSM2 to CSM7 which are applied to next stage bit multiplexers are a logic "low," the signal output through the bit data transfer path may be a bit counting value D1 of a second bit counter 234-2.

Since description of transferring the second bit counting value D1 is similarly applied to that of transferring the third to eighth bit counting values D2 to D7, the description of transferring the third to eighth bit counting values D2 to D7 will be omitted.

Figure 7:
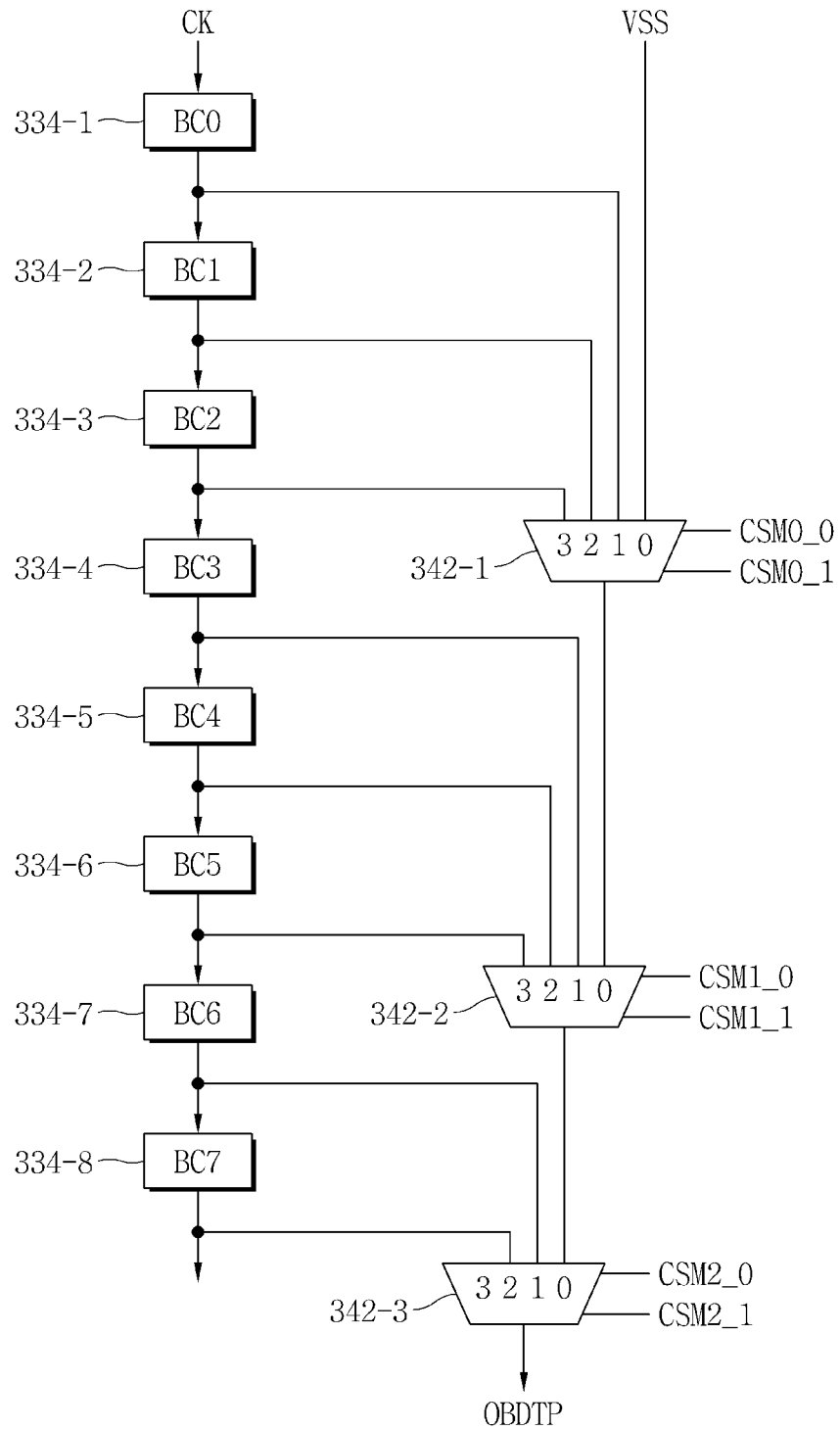
FIG. 7 is a diagram illustrating a circuit to transfer data including a counter and a multiplexer according to still another exemplary embodiment of the present general inventive concept.

FIG. 7 is a diagram illustrating a circuit to transfer data including a counter and a multiplexer according to still another exemplary embodiment of the present general inventive concept.

Referring to FIGS. 2 and 7, one column data transfer circuit corresponding to one column line is illustrated in FIG. 7 for convenience.

The column data transfer circuit may include a column counter 134, a column multiplexer 142, a column memory 152, and a column switch 162, which are related to a corresponding column line.

For example, a first column data transfer circuit corresponding to a first column line CL0 may include a first column counter (CNT0), a first column multiplexer (MUX0), a first column memory (Memory0), and a first column switch (SW0).

In FIG. 7, a column memory and a column switch are omitted from a construction of the column data transfer circuit corresponding to one column line for convenience, but this is because the column memory and the column switch have a similar construction to those of FIG. 3. However, in FIG. 7, since the column counter is an eight bit counter, each of the number of bit memories of the column memory and the number of bit switches of the column switch may be 8. Further, it will be described by supposing that the column data transfer circuit of FIG. 7 corresponds to a first column line CL0 for convenience.

As an example, a first column counter (CNT0) 134-1 may be an eight-bit counter, and eight bit counters may include (BC0) 334-1, (BC1) 334-2, (BC2) 334-3, (BC3) 334-4, (BC4) 334-5, (BC5) 334-6, (BC6) 334-7, and (BC7) 334-8.

The eight bit counters configuring the first column counter (CNT0) 134 may perform an up or down counting operation in response to a clock signal CK.

The first column multiplexer (MUX0) 142 (e.g., as illustrated in FIG. 2) may include a serially connected three bit multiplexers 342-1, 342-2, and 342-3 connected to corresponding bit counters.

A path formed by the serially connected three bit multiplexers 342-1, 342-2, and 342-3 may be referred to as a bit data transfer path to transfer bit data.

A first input terminal of each of the three bit multiplexers 342-1, 342-2, and 342-3 may be connected to an output terminal of a previous stage bit multiplexer, and a second input terminal, a third input terminal, and a fourth input terminal of each of the three bit multiplexers 342-1, 342-2, and 342-3 may be connected to output terminals of corresponding three bit counters, respectively. However, a first input terminal of a first bit multiplexer 342-1 may be connected to a power supply voltage VSS, and a fourth input terminal of a third bit multiplexer 342-3 may not be defined since there is no corresponding bit counter.

Each of the three bit multiplexers 342-1, 342-2, and 342-3 may selectively output bit counting values of corresponding bit counters, or an output signal of a previous stage bit multiplexer in response to corresponding control signals. However, the first bit multiplexer 342-1 may selectively output bit counting values of corresponding bit counters 334-1, 334-2,and 334-3, or the power supply voltage VSS in response to corresponding bit multiplexer control signals CSM0_0 and CSM0_1.

For example, the first bit multiplexer 342-1 may selectively output one among bit counting values of the first to third bit counters 334-1 to 334-3 and the power supply voltage VSS according to combinations of logic states of the first control signal CSM0_0 and the second control signal CSM0_1. For example, the first bit multiplexer 342-1 may output the power supply voltage VSS when both the first control signal CSM0_0 and the second control signal CSM0_1 are a logic "low." The first bit multiplexer 342-1 may output a bit counting value of the corresponding bit counter 334-1 when the first control signal CSM0_0 is logic "high" and the second control signal CSM0_1 is a logic "low." The first bit multiplexer 342-1 may output a bit counting value of the corresponding bit counter 334-2 when the first control signal CSM0_0 is logic "low" and the second control signal CSM0_1 is a logic "high." The first bit multiplexer 342-1 may output a bit counting value of the corresponding bit counter 334-3 when both the first control signal CSM0_0 is a logic "high" and the second control signal CSM0_1 is a logic "high."

The second bit multiplexer 342-2 may selectively output one among bit counting values of the fourth to sixth bit counters 334-4 to 334-6 and an output signal of a previous stage bit multiplexer 342-1 according to combinations of logic states of the first control signal CSM1_0 and the second control signal CSM1_1. For example, the second bit multiplexer 342-2 may output an output signal of the first bit multiplexer 342-1 when both the first control signal CSM1_0 and the second control signal CSM1_1 are a logic "low." The second bit multiplexer 342-2 may output a bit counting value of the corresponding bit counter 334-4 when the first control signal CSM1_0 is logic "high" and the second control signal CSM1_1 is a logic "low." The second bit multiplexer 342-2 may output a bit counting value of the corresponding bit counter 334-5 when the first control signal CSM1_0 is logic "low" and the second control signal CSM1_1 is a logic "high." The second bit multiplexer 342-2 may output a bit counting value of the corresponding bit counter 334-6 when both the first control signal CSM1_0 is a logic "high" and the second control signal CSM1_1 is a logic "high."

The third bit multiplexer 342-3 may selectively output one among bit counting values of the seventh and eighth bit counters 334-7 and 334-8 and an output signal of a previous stage bit multiplexer 342-2 according to combinations of logic states of the first control signal CSM2_0 and the second control signal CSM2_1. The combinations of logic states may be similar to the examples discussed above in connection with the second bit multiplexer 342-2.

Consequently, the last stage third bit multiplexer 342-3 may output a signal OBDTP output through the bit data transfer path.

In still another embodiment, the number of bit counters corresponding to each bit multiplexer is 3, and the number of control signals of each bit multiplexer is 2. However, according to other embodiments, each bit multiplexer may be connected to a bit counters, and selectively output an input signal according to b control signals. Here, a and b are natural numbers, and $2^b = a+1$.

FIG. 8 is a logic diagram illustrating an operation of the circuit to transfer data illustrated in FIG. 7.

Referring to FIGS. 7 and 8, when every bit multiplexer control signal CSM0_0, CSM0_1, CSM1_0, CSM1_1, CSM0_0, CSM2_0, and CSM2_1 is in a logic "low" state, a signal OBDTP output through the bit data transfer path may be a power supply voltage VSS.

When a first control signal CSM0_0 of a first bit multiplexer 342-1 is in a logic "high" state, a second control signal CSM0_1 of the first bit multiplexer 342-1 is in a logic "low" state and every bit multiplexer control signal of next stage bit multiplexers is in a logic "low" state, a signal OBDTP output through the bit data transfer path may be a bit counting value D0 of the first bit counter 334-1.

When a first control signal CSM0_0 of the first bit multiplexer 342-1 is in a logic "low" state, a second control signal CSM0_1 of the first bit multiplexer 342-1 is in a logic "high" state and every bit multiplexer control signal of the next stage bit multiplexers is in a logic "low" state, a signal OBDTP output through the bit data transfer path may be a bit counting value D1 of the second bit counter 334-2.

Since description of transferring the second bit counting value D1 is similarly applied to that of transferring third to eighth bit counting values D2 to D7, the description of transferring the third to eighth bit counting values D2 to D7 will be omitted. Here, X represents "don't care."

Figure 9:
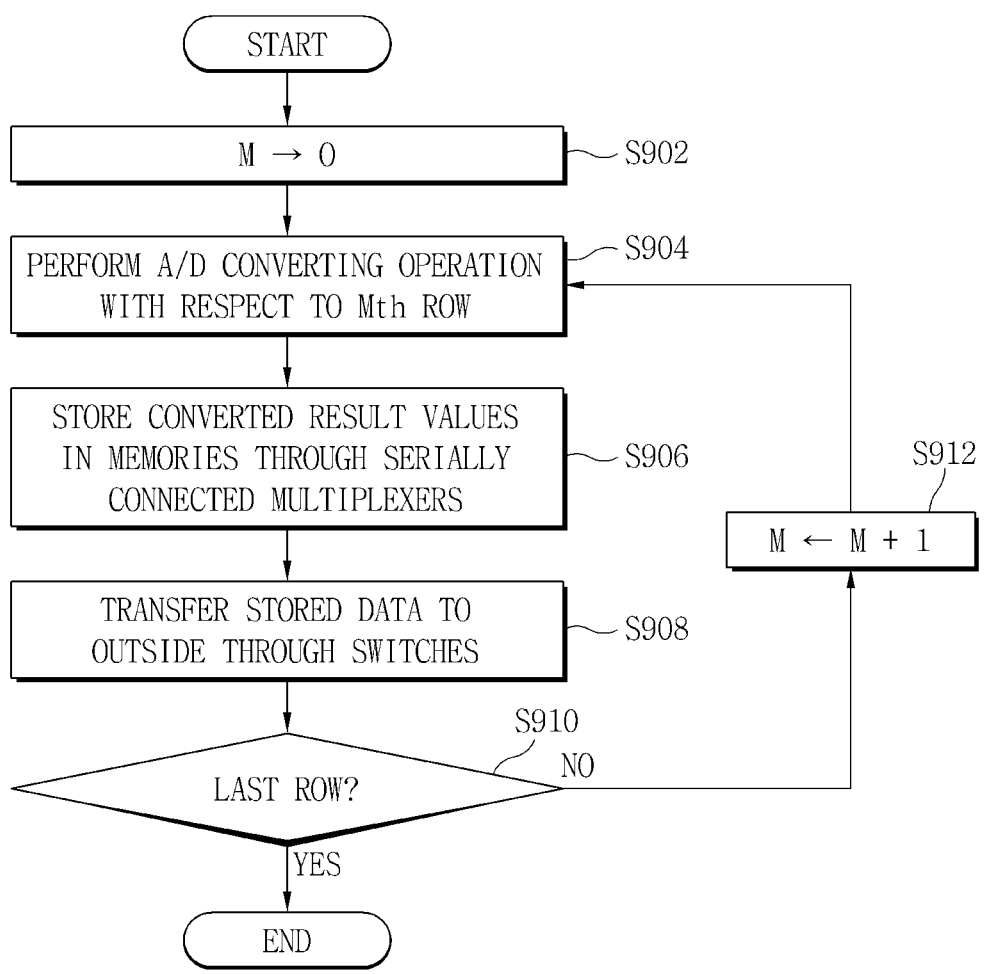
FIG. 9 is a flowchart illustrating a method of transferring data according to an exemplary embodiment of the present general inventive concept.

FIG. 9 is a flowchart illustrating a method of transferring data according to an exemplary embodiment of the present general inventive concept.

Referring to FIGS. 2, 3 and 9, a method of transferring data may include performing an analog to digital (A/D) converting operation in units of column lines with respect to an amount of light incident on unit pixels 122 connected to a first row line RL0 at operations S902 and S904. That is, in operation S902, a variable M representing a row number is set to zero (0), and, in operation S904, analog to digital conversion is performed with respect to the Mth row (e.g., the $0^{th}$ row as set in operation S902).

The method may include storing the converted result values in memories through serially connected multiplexers in units of the column lines at operation S906.

The method may include transferring the data stored in the memories to the outside through switches in units of the column lines at operation S908. At this time, the transferring of the data may be sequentially performed from a first column line to the last column line.

The method may include sequentially performing operations S904, S906, and S908 on remaining row lines in operations S910 and S912. That is, in operation S910, it is determined whether operations S904, S906, and S908 were performed on the last row line. If it is determined that it is not the last row line, the variable M representing the row number is incremented at operation S912, and the method performs operations S904, S906, and S908 with respect to the incremented row number.

Figure 10:
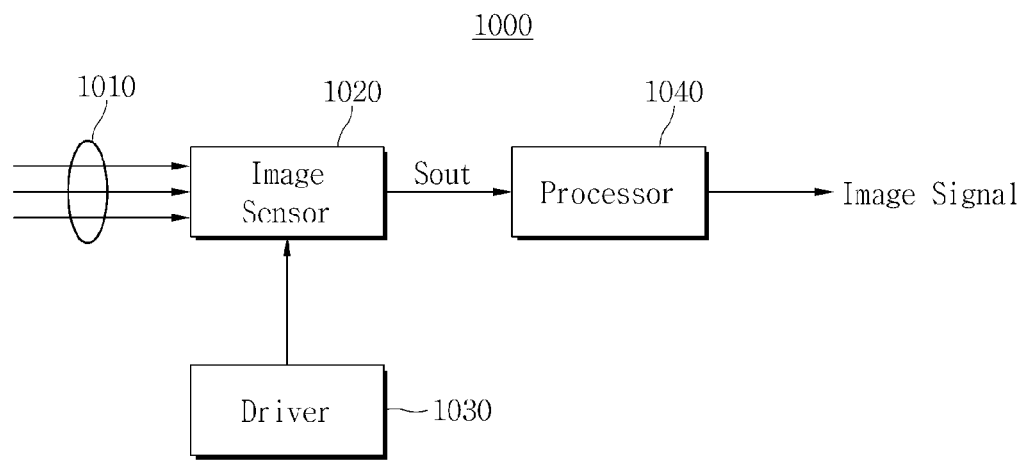
FIG. 10 is a block diagram illustrating a camera system including the image sensor according to an exemplary embodiment of the present general inventive concept.

FIG. 10 is a diagram of a camera system including an image sensor according to an exemplary embodiment of the present general inventive concept.

Referring to FIG. 10, a camera system 1000 may include an optical lens 1010 to focus incident light on a pixel array of an image sensor (e.g., image sensor 1020), an image sensor 1020 to convert the focused incident light into an electric signal, a driver 1030 to drive the image sensor 1020, and a processor 1040 to process the electric signal output from the image sensor 1020 and to output an image signal.

The image sensor 1020 may include the image sensor described in FIGS. 1 to 8.

The driver 1030 may drive the image sensor 1020 using various timing signals including a clock pulse, etc. driving a circuit in the image sensor 1020. The driver 1030 may be one or more circuits and/or an integrated circuit to control the operation of the image sensor 1020.

The processor 1040 may perform a signal processing operation such as a correlated double sampling (CDS)

operation, a sharpening operation, a motion and/or blur-reduction operation, a color-correction operation, etc. on an output signal of the image sensor 1020.

Figure 11:
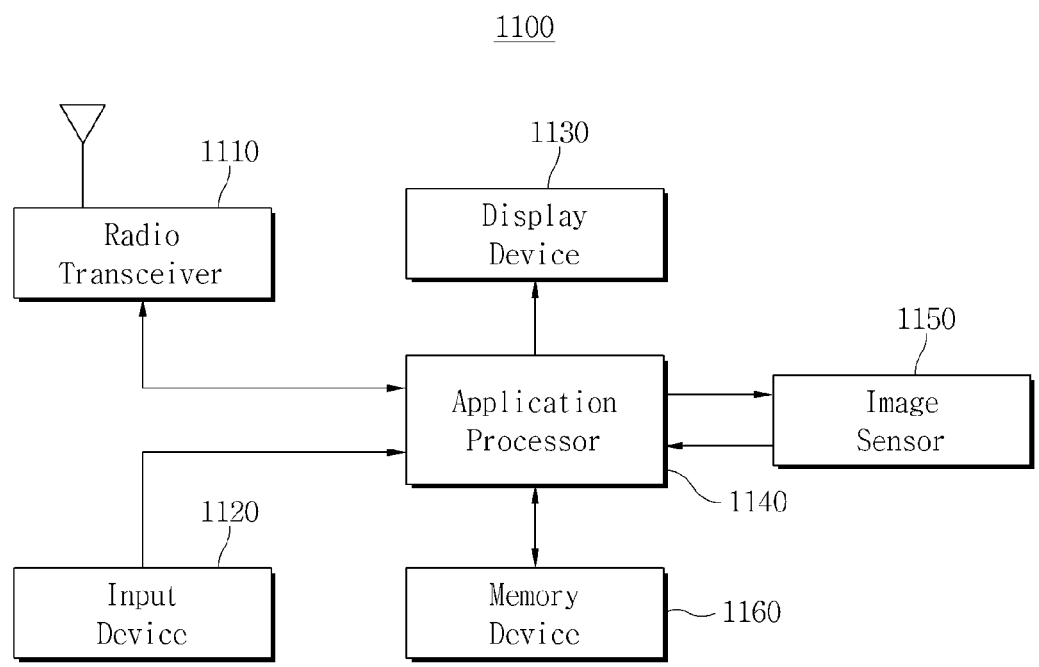
FIG. 11 is a block diagram illustrating a computer system including an image sensor according to an exemplary embodiment of the present general inventive concept.

FIG. 11 illustrates a computer system including an image sensor according to an exemplary embodiment of the present general inventive concept.

Referring to FIG. 11, a computer system 1100 may include a radio transceiver 1110, an input device 1120, a display device 1130, an application processor 1140, an image sensor 1150, and a memory device 1160. The computer system 110 may be a mobile phone, a personal digital assistant (PDA), a laptop computer, a desktop computer, a tablet computer, etc.

The radio transceiver 1110 may be an electrical circuit to transmit and receive a radio signal through an antenna. For example, the radio transceiver 1110 may convert the radio signal received through the antenna into a signal being processed in the application processor 1140, and output the converted signal to the application processor 1140.

The radio transceiver 1110 may receive a signal processed in the application processor 1140, convert the received signal into a radio signal suitable for radio communication, and transmit the converted signal to the outside through the antenna.

The input device 1120 may a device capable of inputting a control signal to control an operation of the application processor 1140 or data being processed by the application processor 1140, and may be implemented as a pointing device such as a touch pad or a computer mouse, a keypad, or a keyboard.

The display device 1130 may receive the image signal processed by the application processor 1140, and display an image according to the received image signal. The display device 1130 may be a display screen and/or a touch screen.

The application processor 1140 may download one or more application programs stored in the memory device 1160, and execute a specific application. Specifically, the application processor 1140 may be any suitable processor and/or integrated circuit that may encode the image sensed by the image sensor 1150 according to an exemplary embodiment of the present general inventive concept. The encoded image may be transmitted to the memory device 1160 to be stored and/or the radio transceiver 1110 to be transmitted.

The image sensor 1150 may convert an incident optical image into a digital signal in response to the control signal from the application processor 1140, and transmit the digital signal to the application processor 1140.

The image sensor 1150 may include the image sensor described above in connection with FIGS. 1 to 8.

The memory device 1160 may store data processed in the application processor 1140, and store the one or more application programs. Specifically, the memory device 1160 may store a video signal encoded by the application processor 1140.

The present general inventive concept may be applied to an image sensor.

According to the present general inventive concept, data sensed by the image sensor can be effectively transferred at a high speed without occurring a short between transfer data.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An image sensor, comprising:
   a converter configured to convert a photoelectric converted analog signal in a unit pixel into a digital signal including a plurality of bits, wherein the converter includes a plurality of bit counters;
   a data transfer circuit configured to selectively output the converted digital signal output from the converter in units of bits in response to a control signal, and including a plurality of multiplexers corresponding to the plurality of bit counters, respectively, and being serially connected; and
   a memory configured to store data output from the data transfer unit, wherein,
   each of first input terminals of remaining multiplexers excluding a first stage multiplexer among the plurality of multiplexers is connected to an output terminal of a previous stage multiplexer; and
   a second input terminal of each of the plurality of multiplexers is connected to a corresponding bit counter of the plurality of bit counters.

2. The image sensor according to claim 1, wherein the number of the bit counters equals the number of the multiplexers.

3. The image sensor according to claim 1, wherein a first input terminal of the first stage multiplexer is connected to a power supply voltage.

4. The image sensor according to claim 1, wherein each of the plurality of multiplexers selectively outputs an input signal of the first input terminal in response to a first state of a corresponding control signal, and selectively outputs an input signal of the second input terminal in response to a second state of the corresponding control signal.

5. The image sensor according to claim 4, wherein the first state of the control signal is a logic "low" state, and the second state of the control signal is a logic "high" state.

6. An image sensor, comprising:
   a converter configured to convert a photoelectric converted analog signal in a unit pixel into a digital signal including a plurality of bits;
   a data transfer circuit configured to selectively output the converted digital signal output from the converter in units of bits in response to a control signal, and including a plurality of switching circuits which are serially connected; and
   a memory configured to store data output from the data transfer unit, wherein:
   the converter comprises multi-bit counters grouped sequentially into different groups;
   the data transfer unit comprises serially connected multiplexers corresponding to the groups of the connected multi-bit counters;
   each of first input terminals of remaining multiplexers excluding a first stage multiplexer among the serially connected multiplexers is connected to an output terminal of a previous stage multiplexer; and
   each of remaining input terminals of each of the multiplexers is connected to a corresponding bit counter.

7. The image sensor according to claim 6, wherein an input terminal of the first stage multiplexer is connected to a power supply voltage.

8. The image sensor according to claim 6, wherein each of the multiplexers selectively outputs one among input signals of input terminals in response to states of corresponding control signals.

9. The image sensor according to claim 8, wherein, when states of the control signals are in a first state, an input signal of a first input terminal among the input terminals is selectively output, and when a control signal corresponding to each of remaining input terminals excluding the first input terminal is transitioned from the first state to a second state, an input signal of remaining input terminals excluding the first input terminal is selectively output.

10. The image sensor according to claim 9, wherein the first state is a logic "low" state and the second state is a logic "high" state.

11. An image sensor, comprising:
- a converter configured to convert a photoelectric converted analog signal in a unit pixel into a digital signal including a plurality of bits;
- a data transfer circuit configured to selectively output the converted digital signal output from the converter in units of bits in response to a control signal, and including a plurality of switching circuits which are serially connected; and
- a memory configured to store data output from the data transfer unit, wherein:
- the converter comprises 'n' bit counters, where 'n' is a natural number which is equal to 8, and the 'n' bit counters are grouped by 'a' sequentially connected bit counters, where 'a' is a natural number which is equal to 3;
- the data transfer unit comprises serially connected multiplexers corresponding to the groups of the a sequentially connected bit counters, respectively;
- each of first input terminals of remaining multiplexers excluding a first stage multiplexer among the serially connected multiplexers is connected to an output terminal of a previous multiplexer;
- each of remaining 'a' input terminals of each of the multiplexers is connected to a corresponding bit counter; and
- each of the multiplexers selectively outputs an input signal according to 'b' control signals, where $2^b = a+1$.

12. The image sensor according to claim 11, wherein each of the multiplexers selectively outputs one among input signals of the 'a+1' input terminals in response to states of corresponding 'b' control signals.

13. The image sensor according to claim 12, wherein the input signals of the 'a+1' input terminals are selectively output according to combinations of states of the 'b' control signals.

* * * * *